US008525195B2

(12) United States Patent
Nago et al.

(10) Patent No.: US 8,525,195 B2
(45) Date of Patent: Sep. 3, 2013

(54) SEMICONDUCTOR LIGHT EMITTING DEVICE

(75) Inventors: Hajime Nago, Kanagawa-ken (JP);
Koichi Tachibana, Kanagawa-ken (JP);
Toshiki Hikosaka, Tokyo (JP); Shigeya Kimura, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 330 days.

(21) Appl. No.: 12/873,662

(22) Filed: Sep. 1, 2010

(65) Prior Publication Data
US 2011/0198583 A1 Aug. 18, 2011

(30) Foreign Application Priority Data

Feb. 12, 2010 (JP) ................................. 2010-029516

(51) Int. Cl.
*H01L 33/02* (2010.01)
(52) U.S. Cl.
USPC .................. 257/94; 257/13; 257/43; 257/76; 257/E33.013; 257/E33.023
(58) Field of Classification Search
None
See application file for complete search history.

(56) References Cited

U.S. PATENT DOCUMENTS

| 6,388,275 | B1 | 5/2002 | Kano |
|---|---|---|---|
| 2003/0006418 | A1 | 1/2003 | Emerson et al. |
| 2005/0045895 | A1 | 3/2005 | Emerson et al. |
| 2007/0284588 | A1 | 12/2007 | Kinoshita |
| 2008/0087877 | A1 | 4/2008 | Lee |
| 2008/0191195 | A1* | 8/2008 | Tanizawa et al. ............... 257/14 |
| 2008/0251781 | A1* | 10/2008 | Han et al. ......................... 257/13 |
| 2010/0133508 | A1 | 6/2010 | Bergmann et al. |
| 2010/0200877 | A1 | 8/2010 | Lee |
| 2012/0018701 | A1 | 1/2012 | Bergmann et al. |

FOREIGN PATENT DOCUMENTS

| EP | 1018770 A1 | 7/2000 |
|---|---|---|
| EP | 1727212 A1 | 11/2006 |
| JP | 3427265 | 5/2003 |
| JP | 2005-268581 | 9/2005 |
| JP | 2008-270805 | 11/2008 |

(Continued)

OTHER PUBLICATIONS

Office Action issued Feb. 20, 2012 in Japan Application No. 2010-029516 (With English Translation).

(Continued)

*Primary Examiner* — Minh-Loan T Tran
*Assistant Examiner* — Fazli Erdem
(74) *Attorney, Agent, or Firm* — Oblon, Spivak, McClelland, Maier & Neustadt, L.L.P.

(57) ABSTRACT

According to one embodiment, a semiconductor light emitting device includes n-type and p-type semiconductor layers, a light emitting portion, a multilayered structural body, and an n-side intermediate layer. The light emitting portion is provided between the semiconductor layers. The light emitting portion includes barrier layers containing GaN, and a well layer provided between the barrier layers. The well layer contains $In_{x1}Ga_{1-x1}N$. The body is provided between the n-type semiconductor layer and the light emitting portion. The body includes: first layers containing GaN, and a second layer provided between the first layers. The second layer contains $In_{x2}Ga_{1-x2}N$. Second In composition ratio x2 is not less than 0.6 times of first In composition ratio x1 and is lower than the first In composition x1. The intermediate layer is provided between the body and the light emitting portion and includes a third layer containing $Al_{y1}Ga_{1-y1}N$ ($0<y1\leq0.01$).

19 Claims, 8 Drawing Sheets

(56) References Cited

FOREIGN PATENT DOCUMENTS

| KR | 10-2004-0029165 | 4/2004 |
| KR | 10-0835116 | 6/2008 |
| WO | WO 99/46822 | 9/1999 |
| WO | WO 02/097904 A2 | 12/2002 |
| WO | WO 2006/022496 A1 | 3/2006 |

OTHER PUBLICATIONS

Korean Office Action issued May 17, 2012, in Patent Application No. 10-2010-0087420 (with English-language translation).
Extended European Search Report issued Jun. 26, 2012 in Patenet Application No. 10251557.4 with English Translation.
Notification of Comments issued Sep. 4, 2012 in Korean Patent Application No. 10-2012-64300 (with English translation).
Korean Office Action issued Oct. 12, 2011, in Patent Application No. 10-2010-0087420 (with English-language translation).
U.S. Appl. No. 12/875,822, filed Sep. 3, 2010, Kimura, et al.
Chinese Office Action issued Nov. 29, 2012, in China Patent Application No. 201010275566.7 (with English translation).
European Exaimination Report mailed Apr. 2, 2013 in European Application No. 10251557.4.

* cited by examiner

SEMICONDUCTOR LIGHT EMITTING DEVICE

CROSS-REFERENCE TO RELATED APPLICATIONS

This application is based upon and claims the benefit of priority from the prior Japanese Patent Application No. 2010-029516, filed on Feb. 12, 2010; the entire contents of which are incorporated herein by reference.

FIELD

Embodiments described herein relate generally to a semiconductor light emitting device.

BACKGROUND

Using nitride-based III-V group compound semiconductors such as gallium nitride (GaN), there have been developed semiconductor light emitting devices such as high-intensity ultraviolet to blue and green light emitting diodes (LED) and blue-violet to blue and green laser diodes (LD).

These semiconductor light emitting devices are required to improve light emitting efficiency while suppressing an operating voltage.

JP-B 3427265 proposes the configuration of a nitride semiconductor light emitting device in which a layer including a base layer made of undoped GaN and an intermediate layer made of n-type impurity-doped GaN is provided between an n-type contact layer and n-type multilayered film layer with a view to improving light emitting efficiency and obtaining a preferable electrostatic withstand pressure.

In general, a gallium nitride semiconductor light emitting device is formed on, for example, a sapphire substrate and generates compressive stress in an epitaxially grown layer due to a difference in coefficients of thermal expansion between the substrate and the epitaxially grown layer. This compressive stress causes an accumulation of distortions in a quantum well layer of an active layer, for example. As a result, the influence of piezoelectric field becomes obvious, which prevents a light emitting output from being improved. Therefore, there is a room for improvement in terms of stress relaxation.

DETAILED DESCRIPTION

Figure 1:
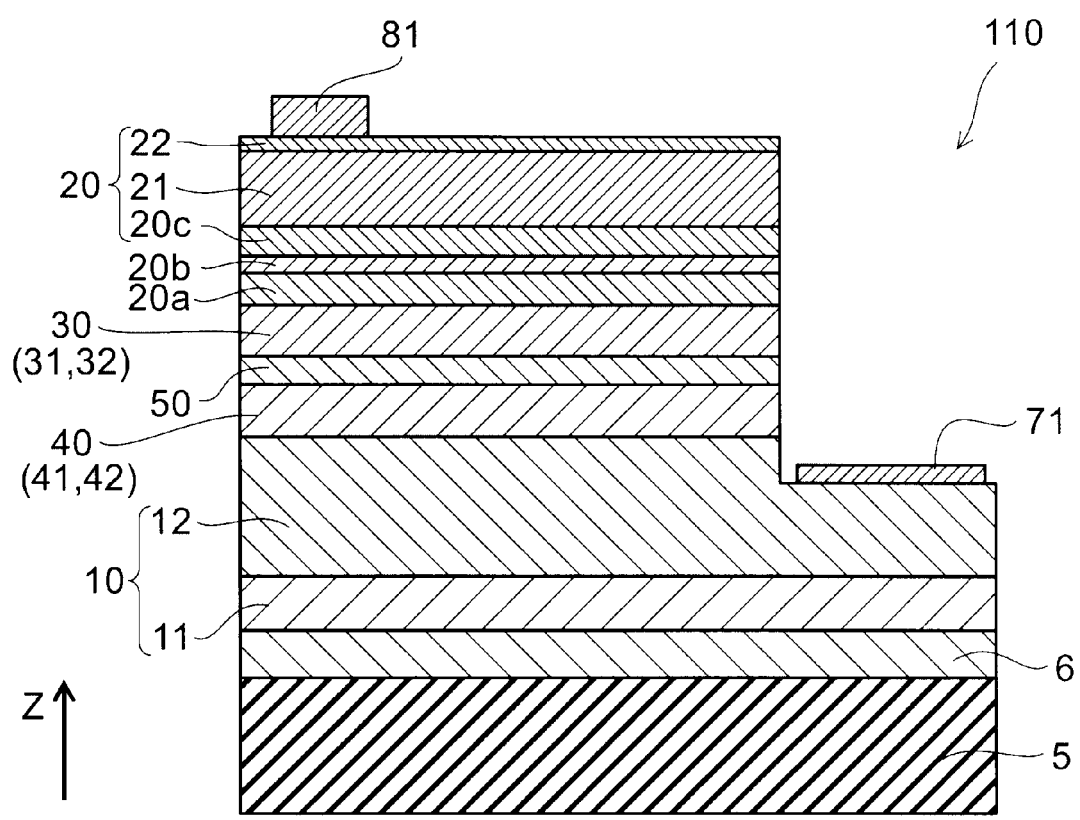
FIG. 1 is a schematic cross-sectional view showing a semiconductor light emitting device.

In general, according to one embodiment, a semiconductor light emitting device includes an n-type semiconductor layer, a p-type semiconductor layer, a light emitting portion, a multilayered structural body, and an n-side intermediate layer. The n-type semiconductor layer contains a nitride semiconductor. The p-type semiconductor layer contains a nitride semiconductor. The light emitting portion is provided between the n-type semiconductor layer and the p-type semiconductor layer. The light emitting portion includes a plurality of barrier layers stacked mutually and containing GaN, and a well layer provided between one of the plurality of barrier layers and another of the plurality of barrier layers. The well layer contains $In_x1Ga_{1-x}1N$, where first In composition ratio x1 is an atomic ratio of In among group III elements. The multilayered structural body is provided between the n-type semiconductor layer and the light emitting portion. The multilayered structural body includes: a plurality of first layers stacked mutually and containing GaN, and a second layer provided between one of the plurality of first layers and another of the plurality of first layers. The second layer contains $In_x2Ga_{1-x}2N$, where second In composition ratio x2 is an atomic ratio of In among group III elements, The second In composition ratio x2 is not less than 0.6 times of the first In composition ratio x1 and is lower than the first In composition ratio x1. The n-side intermediate layer is provided between the multilayered structural body and the light emitting portion and includes a third layer containing $Al_y1Ga_{1-y}1N$, where first Al composition ratio y1 is an atomic ratio of Al among group III elements, the first Al composition ratio y1 being higher than 0 and not higher than 0.01.

Hereinafter, embodiments of the invention will be described in detail with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

FIG. 1 is a schematic cross-sectional view illustrating the configuration of a semiconductor light emitting device according to an embodiment of the invention.

Figure 2:
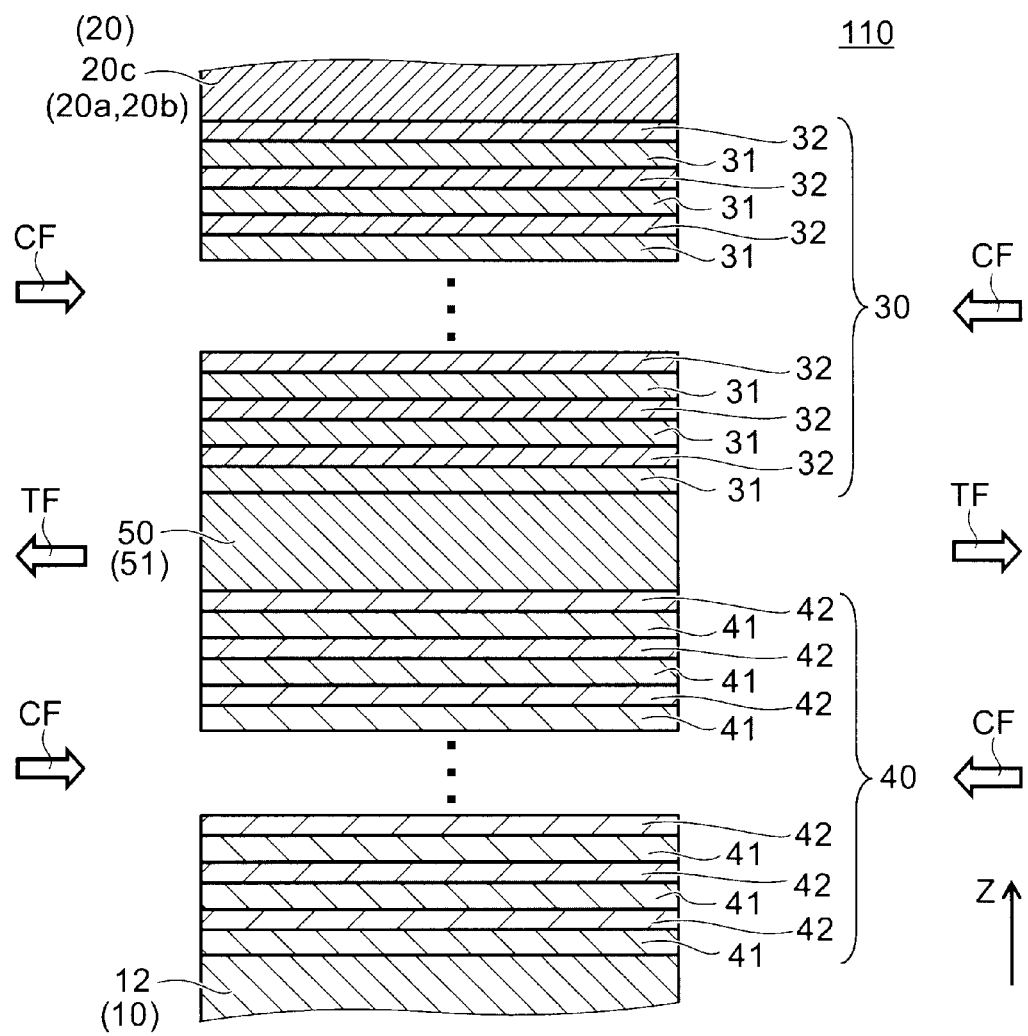
FIG. 2 is a schematic cross-sectional view showing part of the semiconductor light emitting device.

FIG. 2 is a schematic cross-sectional view illustrating part of the configuration of the semiconductor light emitting device according to the embodiment of the invention.

As shown in FIG. 1 and FIG. 2, a semiconductor light emitting device 110 according to the embodiment of the invention includes an n-type semiconductor layer 10 containing a nitride semiconductor, a p-type semiconductor layer 20 containing a nitride semiconductor, a light emitting portion 30 provided between the n-type semiconductor layer 10 and the p-type semiconductor layer 20, a multilayered structural body 40 provided between the n-type semiconductor layer 10 and the light emitting portion 30, and an n-side intermediate layer 50 provided between the multilayered structural body 40 and the light emitting portion 30.

As shown in FIG. 1, the n-type semiconductor layer 10, the multilayered structural body 40, the n-side intermediate layer 50, the light emitting portion 30, and the p-type semiconductor layer 20 are stacked along a Z-axis direction.

The light emitting portion 30 has multiple barrier layers 31 which are stacked with one another and well layers 32 (quantum well layers), each of which is provided between the barrier layers 31. Each of the multiple barrier layers 31 contains GaN. Each of the multiple well layers 32 contains InGaN with a first In composition ratio. The multiple barrier layers 31 and the multiple well layers 32 are stacked along the Z-axis direction.

The multilayered structural body 40 has multiple first layers 41 which are stacked with one another and multiple second layers 42, each of which is provided between the first layers 41. Each of the multiple first layers 41 contains GaN. Each of the multiple second layers 42 contains InGaN with a second In composition ratio. The second In composition ratio is equal to 0.6 times the first In composition ratio or larger than 0.6 times the first In composition ratio. The second In composition ratio is lower than the first In composition ratio. The multiple first layers 41 and the multiple second layers 42 are stacked along the Z-axis direction.

Here, the In composition ratios (the first and second In composition ratios) indicate a ratio (atomic ratio) of In among the group III elements.

The first layer 41 and the second layer 42 are superlattice layers, for example.

The n-side intermediate layer 50 includes a third layer 51 containing $Al_y1Ga_{1-y}1N$ ($0<y1\leqq0.01$).

As shown in FIG. 1, the n-type semiconductor layer 10 may have, for example, a base GaN layer 11 and an n-type contact layer 12 provided between the base GaN layer 11 and the multilayered structural body 40. The n-type contact layer 12 uses, for example, GaN or InGaN into which an n-type impurity such as Si is doped.

The p-type semiconductor layer 20 may have, for example, a p-type GaN contact layer 22, a p-type AlGaN layer 20c provided between the p-type GaN contact layer 22 and the light emitting portion 30, and a p-type GaN clad layer 21 provided between the p-type GaN contact layer 22 and the p-type AlGaN layer 20c. A p-type impurity, such as Mg, is doped into the p-type semiconductor layer 20.

The specific example shown in FIG. 1 has a GaN cap layer 20a provided between the light emitting portion 30 and the p-type semiconductor layer 20 (the p-type AlGaN layer 20c) and an AlGaN cap layer 20b provided between the GaN cap layer 20a and the p-type semiconductor layer 20 (the p-type AlGaN layer 20c). The GaN cap layer 20a and the AlGaN cap layer 20b are provided as needed. The GaN cap layer 20a and the AlGaN cap layer 20b may be considered as part of the p-type semiconductor layer 20 or the light emitting portion 30.

As shown in FIG. 1, the semiconductor light emitting device 110 according to the embodiment may further include a substrate 5 made of, for example, sapphire and a buffer layer 6 provided thereon. The buffer layer 6 has the base GaN layer 11 provided thereon and the base GaN layer 11 has the n-type contact layer 12 provided thereon.

In addition, the multilayered structural body 40 (the first layers 41 and the second layers 42) is provided on the n-type contact layer 12. The n-side intermediate layer 50 is provided on the multilayered structural body 40. The light emitting portion 30 is provided on the n-side intermediate layer 50. The GaN cap layer 20a is provided on the light emitting portion 30. The AlGaN cap layer 20b is provided on the GaN cap layer 20a. The p-type AlGaN layer 20c is provided on the AlGaN cap layer 20b. The p-type GaN clad layer 21 is provided on the p-type AlGaN layer 20c. The p-type GaN contact layer 22 is provided on the p-type GaN clad layer 21.

On a first major surface on the p-type semiconductor layer 20 side of the stacked structural body having the configuration as described above, parts of the p-type semiconductor layer 10, the multilayered structural body 40, the n-side intermediate layer 50, the light emitting portion 30, the p-type semiconductor layer 20 are removed. Thus, the n-type semiconductor layer 10 is exposed on the first major surface side. An n-side electrode 71 is provided in contact with the exposed n-type semiconductor layer 10 and a p-side electrode 81 is provided in contact with the p-type semiconductor layer 20.

In the light emitting portion 30, the barrier layer 31 is a layer containing GaN and the well layer 32 is a layer containing $In_x1Ga_{1-x}1N$, where the first In composition ratio x1 is larger than 0 and smaller than 1. Specifically, the first In composition ratio x1 is, for example, not less than 0.12 and not more than 0.20.

In the multilayered structural body 40, the first layer 41 is a layer containing GaN and the second layer 42 is a layer containing $In_x2Ga_{1-x}2N$, where the second In composition ratio x2 is larger than 0 and smaller than 1. However, the second In composition ratio x2 is equal to or larger than 0.6 times the first In composition ratio x1 and is smaller than the first composition ratio x1. Specifically, the second In composition ratio x2 is, for example, not less than 0.08 and less than 0.12 (where the relationship of $(x1\times 0.6)\leqq x2<x1$ is satisfied).

The second In composition ratio x2 is set to be equal to or larger than 0.6 times the first In composition ratio, which is relatively closer to the first In composition ratio, so that the compressive stress to be applied to the well layers 32 can be relaxed. As a result, the crystallinity can be sufficiently improved. When the second composition ratio x2 is set to be lower than 0.6 times the first composition ratio x1, the effects of the relaxation of the compressive stress may not be sufficiently obtained.

On the other hand, in the case where the second In composition ratio x2 is the same as the first In composition ratio x1, light emitted in the light emitting portion 30 is absorbed by the second layers 42 of the multilayered structural body 40 when the light is going toward the n-type semiconductor layer 10 (substrate 5 side). For this reason, in the embodiment, the second In composition ratio x2 is set to be lower than the first In composition ratio x1. Thereby, the above-described light absorption can be suppressed, and the light emitting efficiency can be increased.

It is preferable that the thickness of the second layer 42 is equal to or smaller than 2 nm (nanometers) in order to obtain a preferable crystallinity.

The thickness of the first layer 41 is set to be equal to or larger than the thickness of the second layer 42. When the thickness of the first layer 41 is smaller than that of the second layer 42, the average In composition in the multilayered structural body 40 is increased. As a result, the compressive stress is accumulated inside the multilayered structural body 40, which may result in inducing crystal defects in interfaces (for example, an interface between the multilayered structural body 40 and the n-type semiconductor layer 10, an interface between the first layer 41 and the second layer 42, etc.). In order to suppress the occurrence of these crystal defects, the thickness of the first layer 41 is set to be equal to or larger than that of the second layer 42.

The first layer 41 may contain an n-type impurity. The n-type impurity may be, for example, Si. In other words, the first layer 41 is a Si-doped GaN layer, for example.

The n-side intermediate layer 50 including the third layer 51 containing $Al_y1Ga_{1-y}1N$ ($0<y1\leqq 0.01$) is provided between the multilayered structural body 40 and the light emitting portion 30, so that the compressive stress to be applied to the light emitting portion 30 can be further relaxed.

In other words, the light emitting portion 30 and the multilayered structural body 40 use an InGaN layer whose average In composition is relatively high. However, such InGaN layer has a large difference in lattice mismatching between the base GaN layer 11 (the undoped GaN layer) and the n-type contact layer 12 (the n-type GaN layer). For example, a difference between the lattice length of GaN and the lattice length of InN is 11%. Furthermore, because the number of the stacked layers of the light emitting portion 30 and the multi-layered structural body 40 is large, the compressive stress is prone to be accumulated. When the compressive stress becomes larger, distortions are accumulated in the well layers 32. As a result, the influence of piezoelectric field becomes obvious, thereby preventing the light emitting efficiency from being improved.

In the embodiment, the n-side intermediate layer 50 including the third layer 51 containing AlGaN whose difference in lattice mismatching with GaN is small is inserted between the multilayered structural body 40 and the light emitting portion 30. The difference between the lattice length of GaN and the lattice length of AlN is 2%, which is extremely smaller than the difference between the lattice length of GaN and the lattice length of InN.

In addition, as illustrated in FIG. 2, the compressive stress CF is caused in the light emitting portion 30 and the multi-layer portion 40, both of which contain InGaN. In contrast, tensile stress TF is caused in the n-side intermediate layer containing AlGaN. Using such n-side intermediate layer 50, the compressive stress CF to be accumulated in the multilayered structural body 40 and the light emitting portion 30 can be weakened.

As described above, the n-side intermediate layer 50 can relax the compressive stress CF to be applied to the multilayered structural body 40 and the light emitting portion 30, so that the crystal defects caused in the multilayered structural body 40 and the light emitting portion 30 can be decreased and the distortions caused in the well layers 32 can be weakened. Consequently, the operating voltage of the semiconductor light emitting device 110 can be decreased and the device characteristics can be improved.

In the third layer 51 of the n-side intermediate layer 50, the Al composition ratio Y1 is set to be larger than 0 and equal to or smaller than 0.01. When the Al composition ratio is larger than 0.01, the crystallinity is prone to be deteriorated and, thus, the light emitting efficiency is also prone to be deteriorated.

The thickness of the n-side intermediate layer 50 may be equal to or smaller than 50 nm, preferably equal to or smaller than nm, for example. When the thickness of the n-side intermediate layer 50 is larger than 50 nm, the crystallinity may be deteriorated. When the thickness of the n-side intermediate layer 50 is set to be equal to or smaller than 50 nm, preferable crystallinity can be obtained and, thus, high light emitting efficiency can be obtained. Furthermore, when the thickness of the n-side intermediate layer 50 is set to be equal to or smaller than 10 nm, more preferable crystallinity can be obtained.

Figure 3:
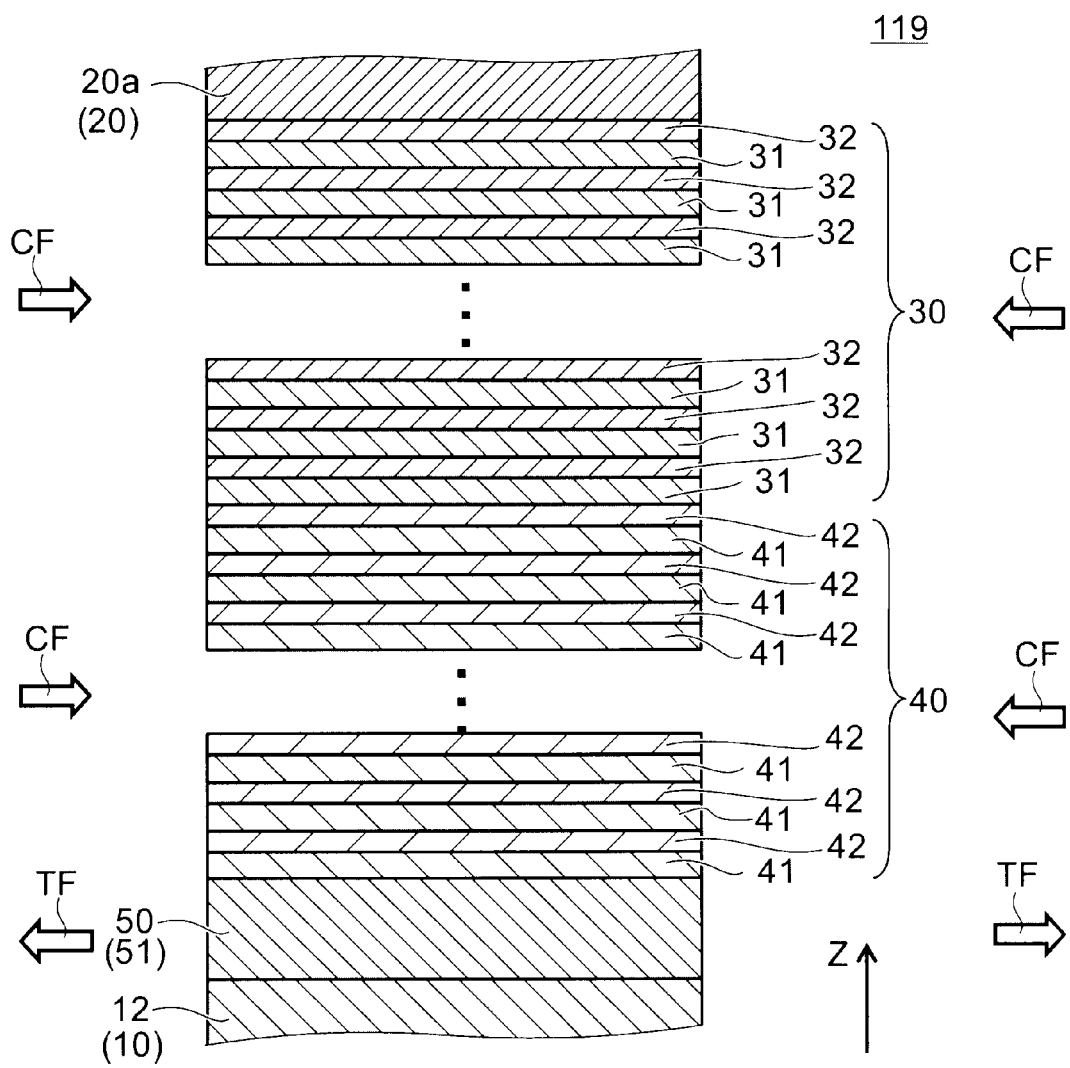
FIG. 3 is a schematic cross-sectional view showing part of a semiconductor light emitting device according to a comparative example.

FIG. 3 is a schematic cross-sectional view illustrating part of the configuration of a semiconductor light emitting device according to a comparative example.

As shown in FIG. 3, in a semiconductor light emitting device 119 according to the comparative example, an n-side intermediate layer 50 including a third layer 51 containing AlGaN is provided between an n-type semiconductor layer 10 and a multilayered structural body 40.

In the semiconductor light emitting device 119 according to the comparative example, the n-side intermediate layer 50 is provided between the n-type semiconductor layer 10 and the multilayered structural body 40. Accordingly, there is a possibility that stress to be caused in the n-type semiconductor layer 10 and the multilayered structural body 40 can be relaxed. However, there is no layer for relaxing the stress between the multilayered structural body 40 and the light emitting portion 30, both of which include a stacked film. For this reason, large compressive stress CF is accumulated in the multilayered structural body 40 and the light emitting portion 30, both of which have the compressive stress CF. Thereby, the light emitting efficiency is easily deteriorated.

In contrast, in the semiconductor light emitting device 110 according to the embodiment, the n-side intermediate layer 50 having the tensile stress TF is inserted between the multilayered structural body 40 causing the compressive stress CF and the light emitting portion 30 causing the compressive stress CF. With this configuration, the compressive stress CF to be accumulated can be relaxed and the high light emitting efficiency can be obtained. As described above, the stress to be caused in the semiconductor layers is relaxed in the embodiment. Thus, a semiconductor light emitting device that operates at a lower voltage and achieves high light emitting efficiency can be obtained.

When a semiconductor layer is epitaxially grown on the substrate 5, a large number of dislocations are caused in the interface between the substrate 5 and the semiconductor layer in which compressive stress is small. However, those dislocations disappear in the course of growing the semiconductor layer and the compressive stress is accumulated in the epitaxially-grown layer. In the embodiment, the n-side intermediate layer 50 having the tensile stress TF is inserted between the multilayered structural body 40 causing the compressive stress CF and the light emitting portion 30 causing the compressive stress CF. With this configuration, the compressive stress CF to be accumulated is relaxed. Consequently, it becomes possible that the influence of the piezoelectric field is suppressed and the light emitting efficiency is further improved.

Figure 4:
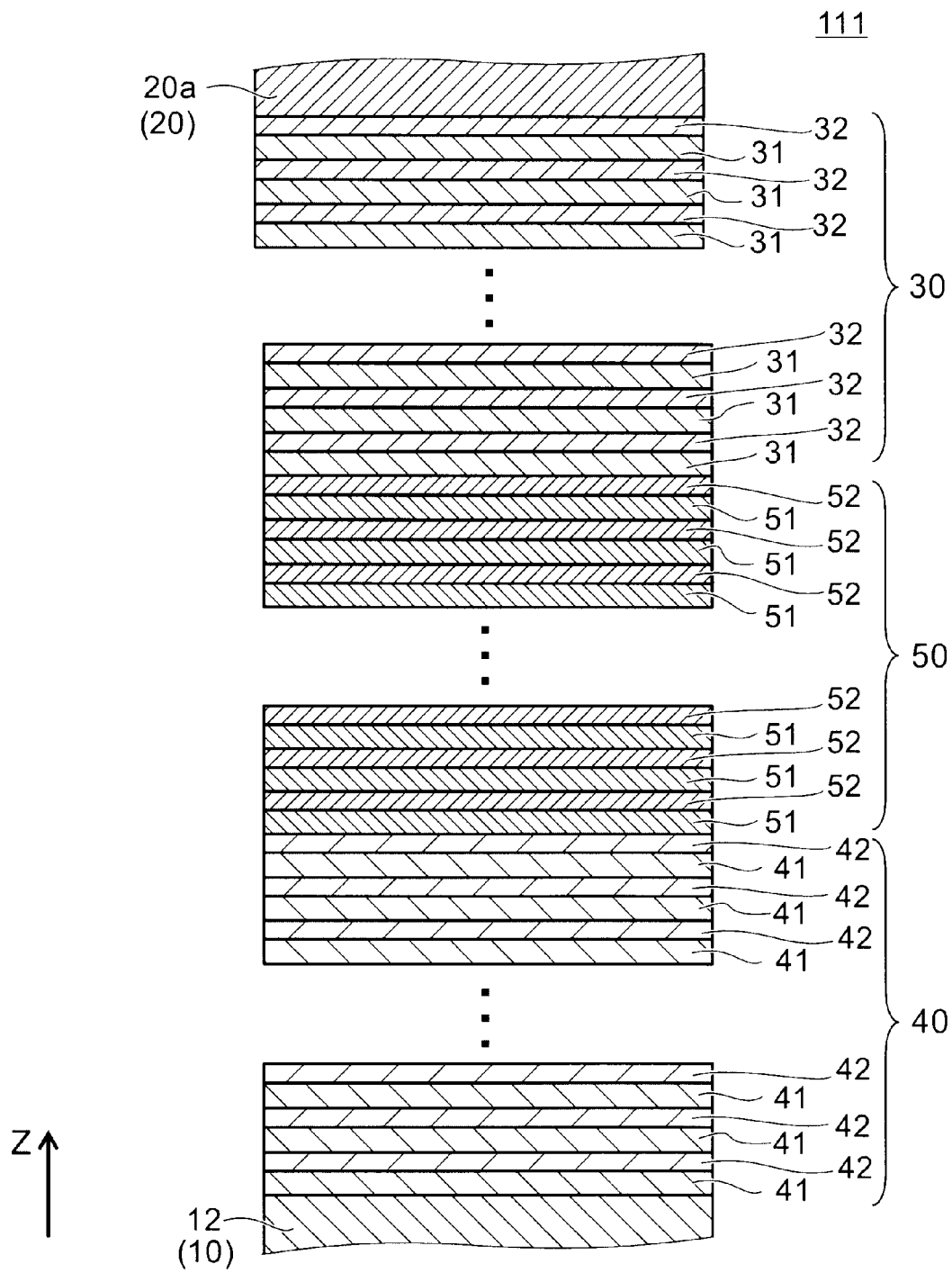
FIG. 4 is a schematic cross-sectional view showing part of a semiconductor light emitting device.

FIG. 4 is a schematic cross-sectional view illustrating part of the configuration of another semiconductor light emitting device according to the embodiment of the invention.

As shown in FIG. 4, another semiconductor light emitting device 111 according to the embodiment has multiple third layers 51 provided in an n-side intermediate layer 50. The multiple third layers 51 are stacked with one another. In other words, the multiple third layers 51 are stacked along the Z-axis direction.

In addition, the n-side intermediate layer 50 further includes fourth layers 52, each of which is provided between the multiple third layers 51. The fourth layer 52 contains an n-type impurity with a concentration higher than that of the n-type impurity contained in the third layer 51. Also, the fourth layer 52 contains $Al_{y2}Ga_{1-y2}N$ ($0<y2\leq 0.01$), where the Al composition ratio y2 in the fourth layer 52 may be the same as or different from the Al composition ratio y1 in the third layer 51. The Al composition ratio y2 is set to be larger than 0 and equal to or smaller than 0.01. When the Al composition ratio y2 is larger than 0.01, the crystallinity is prone to be deteriorated and, thus, the light emitting efficiency is prone to be deteriorated.

For example, the third layer 51 is a non-doped AlGaN layer and the fourth layer 52 is a Si-doped AlGaN layer.

For example, the thickness of the third layer 51 is approximately 1 nm and the thickness of the fourth layer 52 is approximately 1 nm. These third and fourth layers 51 and 52 are alternately stacked to make 25 stacked-layer pairs of the third and fourth layers 51 and 52 (50 layers in total). This stacked film may be used as the n-side intermediate layer 50.

Alternatively, the third layers 51 and the fourth layers 52 are alternatively stacked to make 5 stacked-layer pairs (10 layers in total). This stacked film may be used as the n-side intermediate layer 50.

As described above, a stacked structure of the third layers 51 and the fourth layers 52 is applied as the n-side intermediate layer 50, so that electronic carriers can be effectively injected. Accordingly, the stress in the semiconductor layers is relaxed without deteriorating the device characteristics. Consequently, a semiconductor light emitting device that operates at a lower operating voltage and achieves high light emitting efficiency can be provided.

An example of a method for manufacturing the semiconductor light emitting device 110 is described hereinafter.

In the following description, an example is given by using a case where MOCVD (Metal Organic Chemical Vapor Deposition) is used. However, the example is not limited thereto. The method for manufacturing the semiconductor light emitting device according to the embodiment may adopt any method which is used for growing a nitride semiconductor, such as HVPE (Halide Vapor Phase Epitaxy) and MBE (Molecular Beam Epitaxy).

In addition, the example is given by using a case where materials to be used include trimethyl gallium (TMG), trimethyl aluminum (TMA), trimethyl indium (TMI), Bis(cyclopentadienyl)magnesium ($Cp_2Mg$) and gas materials include ammonium ($NH_3$) and silane ($SiH_4$), and carrier gases include hydrogen and nitrogen. However, these materials are also not limited to the above-described case and any material which can be used for manufacturing the configuration of the semiconductor light emitting device according to the embodiment can be applied. For example, tri-ethyl gallium (TEG) may be used.

The substrate 5 uses a sapphire substrate, for example. Here, the sapphire substrate is inclined by 0.2° with respect to a M-axis direction and includes a C-plane on which cylindrical concavity and convexity, each having a diameter of 3 μm, a height of 1 μm, and a pitch of 5 μm, are provided.

In other words, the major surface of the substrate 5 facing the n-type semiconductor layer 10 may be inclined in the range from 0.1° to 0.5° with respect to the M-axis direction of the substrate 5. With this configuration, the crystallinity of various semiconductor layers to be grown on the substrate 5 is improved. When an angle between the major surface of the substrate 5 and the M-axis direction is smaller than 0.1°, the crystallinity is prone to be deteriorated. When the angle is larger than 0.5°, the crystallinity is also prone to be deteriorated.

In addition, the substrate 5 has concavity and convexity provided on the major surface. With these concavity and convexity, a path of the light emitted from the light emitting portion 30 can be changed, and, thus, light extraction efficiency is improved. The shapes (a planar shape when the concavity and convexity are cut so as to be parallel with the major surface of the substrate 5) of the concavity and convexity can be any shape. Moreover, when a semiconductor layer is grown on the substrate 5, providing the concavity and convexity on the substrate 5 can cause the concavity and convexity to function as cores of the crystal growth, thereby bringing the effects of improving the crystallinity of the semiconductor layer.

The substrate 5 is subject to, for example, an organic cleaning and an acid cleaning as a pretreatment. Thereafter, the substrate 5 is stored inside a MOCVD apparatus.

For example, the temperature of the substrate 5 is increased up to 1100° C. by high-frequency heating in an atmosphere of a mixed gas of a nitride ($N_2$) gas and a hydrogen ($H_2$) gas under a normal pressure. With this treatment, the surface of the substrate 5 is subjected to a gas-phase etching and a natural oxide film which is formed on the surface is removed.

After that, while the $NH_3$ gas is continuously supplied, the temperature of the substrate 5 is decreased down to 500° C. and is kept at 500° C.

Next, using the mixed gas of the $N_2$ gas and the $H_2$ gas as a carrier gas, for example, an ammonium ($NH_3$) gas, TMG (Tri-Methyl Gallium), and TMA (Try-Methyl Aluminum) are supplied as process gases to form a buffer layer 6 containing AlGaN. The thickness of the buffer layer 6 is set to be, for example, 20 nm.

Then, while the $NH_3$ gas is continuously supplied, the temperature of the substrate 5 is increased up to 1100° C. and is kept at 1100° C.

Subsequently, using the mixed gas of the $N_2$ gas and the $H_2$ gas as a carrier gas, for example, an ammonium ($NH_3$) gas and TMG (Tri-Methyl Gallium) are supplied as process gases to form a base GaN layer 11. In the embodiment, the base GaN layer 11 is an undoped layer. The thickness of the base GaN layer 11 is, for example, 3 μm.

Thereafter, for example, silane ($SiH_4$ gas) to serve as an n-type dopant is supplied to form an n-type contact layer 12. The thickness of the n-type contact layer 12 is, for example, 4 μm. The n-type contact layer 12 is a GaN layer containing Si.

After that, the supply of TMG is stopped while the supply of the $NH_3$ gas is continued, and the temperature of the substrate 5 is decreased down to 800° C. and is kept at 800° C.

Next, using the $N_2$ gas as a carrier gas, for example, the $NH_3$ gas, TMG, and the $SiH_4$ gas are supplied as process gases to form a first layer 41. The first layer 41 is a Si-doped GaN layer. The thickness of the first layer 41 is set to be, for example, 2 nm.

Then, the supply of the $SiH_4$ gas is stopped while the supply of TMI (Tri-Methyl Indium) is continued to form a second layer 42. The second layer 42 is an InGaN layer with 0.1 of an In composition ratio (a second In composition ratio x2). The thickness of the second layer 42 is, for example, 1 nm.

Subsequently, the supply and stop of TMI as well as the stop and supply of the $SiH_4$ gas are repeated alternately to form the first layer 41 and the second layer 42 for 30 times, for example. As a result, a multilayered structural body 40 can be obtained.

Thereafter, while TMG and the $NH_3$ gas are continuously supplied, the supply of TMI and the $SiH_4$ gas is stopped and TMA (Tri-Methyl Aluminum) is supplied, so that a third layer 51 of the n-side intermediate layer 50 is formed. The n-side intermediate layer 50 is an undoped layer and is an AlGaN layer whose Al composition ratio Y1 is 0.01. The thickness of the third layer 51 is, for example, 5 nm.

After that, while TMG and the $NH_3$ gas are continuously supplied, the supply of TMA is stopped, so that a barrier layer 31 is formed. The barrier layer 31 is a GaN layer. The thickness of the barrier layer 31 is, for example, 5 nm.

Next, TMI (Tri-Methyl Indium) is supplied to form a well layer 32. The well layer 42 is, for example, an InGaN layer whose In composition ratio (the first In composition ratio x1) is 0.15. The thickness of the well layer 32 is, for example, 2.5 nm.

Then, the supply and stop of TMI is performed repeatedly, so that the barrier layer 31 and the well layer 32 are formed for 7 times, for example. As a result, the light emitting portion 30 having a multiple quantum well structure is obtained.

Subsequently, while TMG and the $NH_3$ gas are continuously supplied, the supply of TMI is stopped, so that a GaN cap layer 20a is formed. The GaN cap layer 20a is, for example, an undoped GaN layer. The thickness of the GaN cap layer 20a is, for example, 5 nm.

Thereafter, while TMG is continuously supplied, TMA (Tri-Methyl Aluminum) is supplied, so that an AlGaN cap layer 20b is formed. The AlGaN cap layer 20b is, for example, an undoped AlGaN layer whose Al composition ratio is 0.003. The thickness of the AlGaN cap layer 20b is, for example, 1 nm.

After that, while the $NH_3$ gas is continuously supplied, the supplies of TMG and TMA are stopped, and the temperature of the substrate 5 is increased up to 1030° C. in the $N_2$ gas atmosphere and is kept at 1030° C.

Next, using the mixed gas of the $N_2$ gas and the $H_2$ gas as a carrier gas, the $NH_3$ gas, TMG, and TMA as process gases, and Bis(cyclopentadienyl)magnesium ($Cp_2Mg$) as a p-type dopant are supplied, so that a p-type AlGaN layer 20c is formed. The Mg concentration of the p-type AlGaN layer 20c is, for example, $1 \times 10^{19 \text{ to } 20}$ cm$^{-3}$. The thickness of the p-type AlGaN layer 20c is, for example, 10 nm. The p-type AlGaN layer 20c functions as an electronic barrier layer (an electronic overflow preventing layer).

Then, while TMG and $Cp_2Mg$ are continuously supplied, the supply of TMA is stopped, so that a p-type GaN clad layer 21 is formed. The Mg concentration of the p-type GaN clad layer 21 is, for example, $2 \times 10^{19}$ cm$^{-3}$. The thickness of the p-type GaN clad layer 21 is, for example, approximately 100 nm.

Subsequently, the amount of supplying $Cp_2Mg$ is increased to form a p-type GaN contact layer 22. The Mg concentration of the p-type GaN contact layer 22 is, for example, $3 \times 10^{20}$ cm$^{-3}$. The thickness of the p-type GaN contact layer 22 is, for example, approximately 10 nm.

Thereafter, while the $NH_3$ gas is continuously supplied, the supply of TMG is stopped and only the carrier gas is continuously supplied, so that the temperature of the substrate 5 is naturally decreased. The supply of the $NH_3$ gas is continued until the temperature of the substrate 5 reaches 500° C.

After that, the substrate 5 is taken out from the MOCVD apparatus and part of the formed stacked structural body of the semiconductor layers is removed to reach the n-type contact layer 12 by, for example, a RIE (Reactive Ion Etching) method, so that part of the n-type contact layer 12 is exposed. For example, an n-side electrode 71 formed of a Ti film/a Pt film/an Au film is formed on the exposed n-type contact layer 12. In addition, a p-side electrode 81 formed of, for example, a Ni film/an Au film is formed on the p-type GaN contact layer 22. As described above, the semiconductor light emitting device 110 illustrated in FIG. 1 is obtained.

With regard to the I-V characteristics of the semiconductor light emitting device 110, for example, an operating voltage is 3.1 V (volt) to 3.5 V when a current is 20 mA, and a light output at this time is approximately 15 mW. The peak wavelength of light emission is approximately 450 nm.

As described above, the stress caused in the semiconductor layers is relaxed in the semiconductor light emitting device 110 according to the embodiment. Thus, a semiconductor light emitting device that operates at a lower operating voltage and achieves high light emitting efficiency can be obtained.

In the above-described manufacturing method, the semiconductor light emitting device 111 can be formed by stacking the multiple third layers 51 and the multiple fourth layers 52 in a process of forming the n-side intermediate layer 50. For example, the multilayered structural body 40 is formed, and, thereafter, the third layers 51 containing undoped AlGaN whose Al composition ratio Y1 is 0.01 are formed. In this case, the thickness of the third layer 51 is set to be, for example, 1 nm. After the third layers 51 are formed, the fourth layers 52 containing Si-doped AlGaN whose Al composition ratio y2 is 0.01 are formed. The thickness of the fourth layer 52 is set to be, for example, 1 nm. Those third and fourth layers 51 and 52 are formed in pair for 5 times (10 layers in total). As a result, the n-side intermediate layer 50 with a thickness of 10 nm is obtained, for example.

Similar to the semiconductor light emitting device 110, the stress caused in the semiconductor layers is relaxed in the semiconductor light emitting device 111 to be manufactured in this way. Thus, a semiconductor light emitting device that operates at a lower operating voltage and achieves high light emitting efficiency can be obtained.

Figure 5:
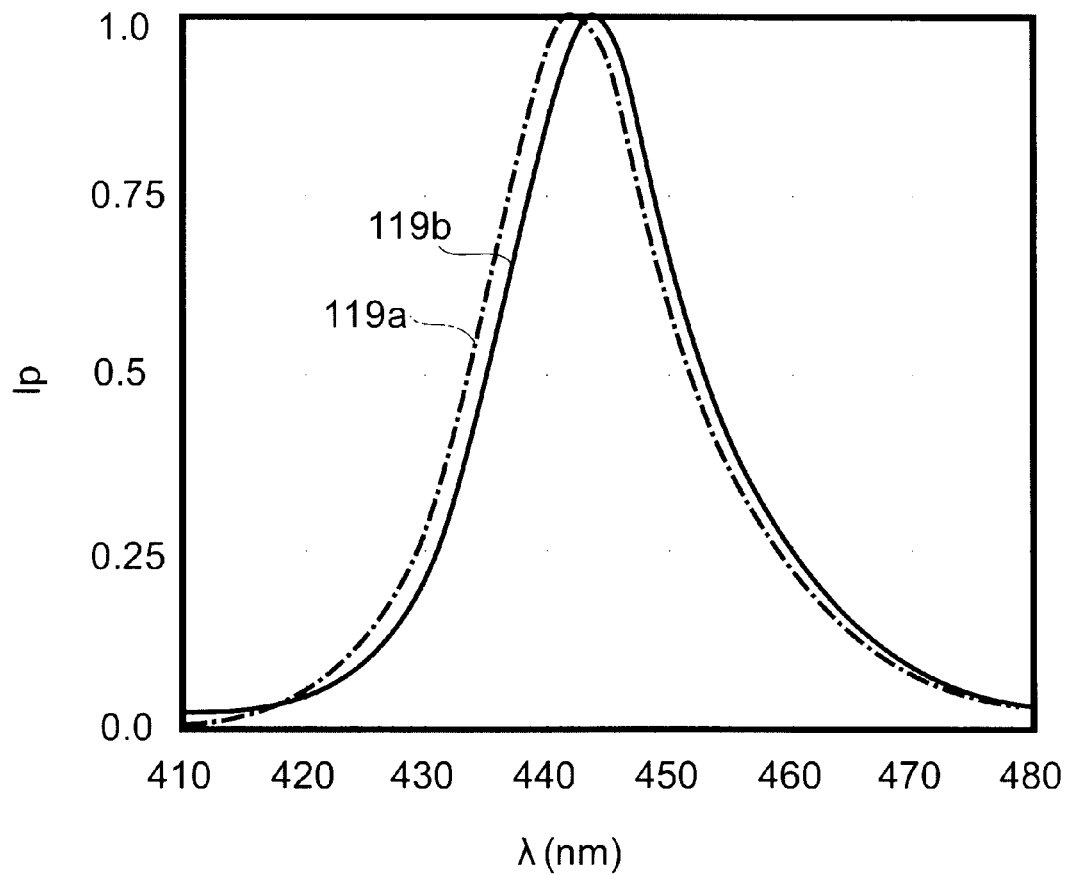
FIG. 5 is a graph showing characteristics of semiconductor light emitting devices.

FIG. 5 is a graph illustrating characteristics of semiconductor light emitting devices.

Specifically, FIG. 5 shows changes of the light emitting characteristics when an In composition ratio in the multilayered structural body 40 of the semiconductor light emitting devices is changed. In FIG. 5, the horizontal axis represents a wavelength λ (nm) and the vertical axis represents light emitting intensity Ip. The light emitting intensity Ip is standardized by setting the maximum intensity as 1.

FIG. 5 illustrates characteristics of a semiconductor light emitting device in which no n-side intermediate layer 50 is provided. Also, FIG. 5 shows characteristics of two types of semiconductor light emitting devices 119a and 119b whose In composition ratios (second In composition ratio x2) are different from each other in the second layers 42 of the multilayered structural body 40. The second In composition ratio x2 is 0.14 in the semiconductor light emitting device 119a and the second In composition ratio x2 is 0.26 in the semiconductor light emitting device 119b.

As shown in FIG. 5, in the semiconductor light emitting device 119b whose second In composition ratio x2 of the second layers 42 of the multilayered structural body 40 is high, the wavelength width of the light emitting intensity Ip is narrower than that of the semiconductor light emitting device 119a. Specifically, a half band width of the light emitting spectrum is reduced by 17.7 nm in the semiconductor light emitting device 119b as compared with that in the semiconductor light emitting device 119a.

In addition, the operating voltage of the semiconductor light emitting device 119a is 3.5V to 3.6V, while the operating voltage of the semiconductor light emitting device 119b is 3.3V. In other words, the operating voltage decreases in a semiconductor light emitting device whose second In composition ratio x2 of the second layer 42 is higher.

Thus, the second In composition ratio x2 of the second layer 42 is increased, so that a preferable characteristic can be obtained.

At this time, for example, it is considered that a growing temperature of the light emitting portion 30 is set to be higher than that of the multilayered structural body 40 in order to further improve the crystallinity of the light emitting portion 30. For example, there is a case where 800° C. is employed as the growing temperature of the multilayered structural body 40 and 850° C. is employed as the growing temperature of the light emitting portion 30.

If the temperature of growing the light emitting portion 30 after formation of the multilayered structural body 40 is set to be higher than the temperature of growing the multilayered structural body 40 in the comparative example where an n-side intermediate layer is not provided, In disappears in the second layers 42 which are formed by setting the In composition ratio to be higher. As a result, the second In composition ratio x2 may be lower than a desired value. In this case, desired characteristics cannot be obtained.

At this time, with regard to the semiconductor light emitting devices 110 and 111 according to the embodiment, an n-side intermediate layer 50 is provided, so that the n-side intermediate layer 50 functions as a cap layer of the multilayered structural body 40. Therefore, even when the temperature of growing the light emitting portion 30 is set to be higher than that of growing the multilayered structural body 40, the disappearance of In can be suppressed in the second layers 42. As a result, a desired second In composition ratio x2 is obtained, and, thus, desired characteristics can be obtained.

As described above, the n-side intermediate layer 50 can achieve a function as a cap layer of the multilayered structural body 40 in addition to a function as a stress relaxation layer to suppress the compression stress CF.

Figure 6:
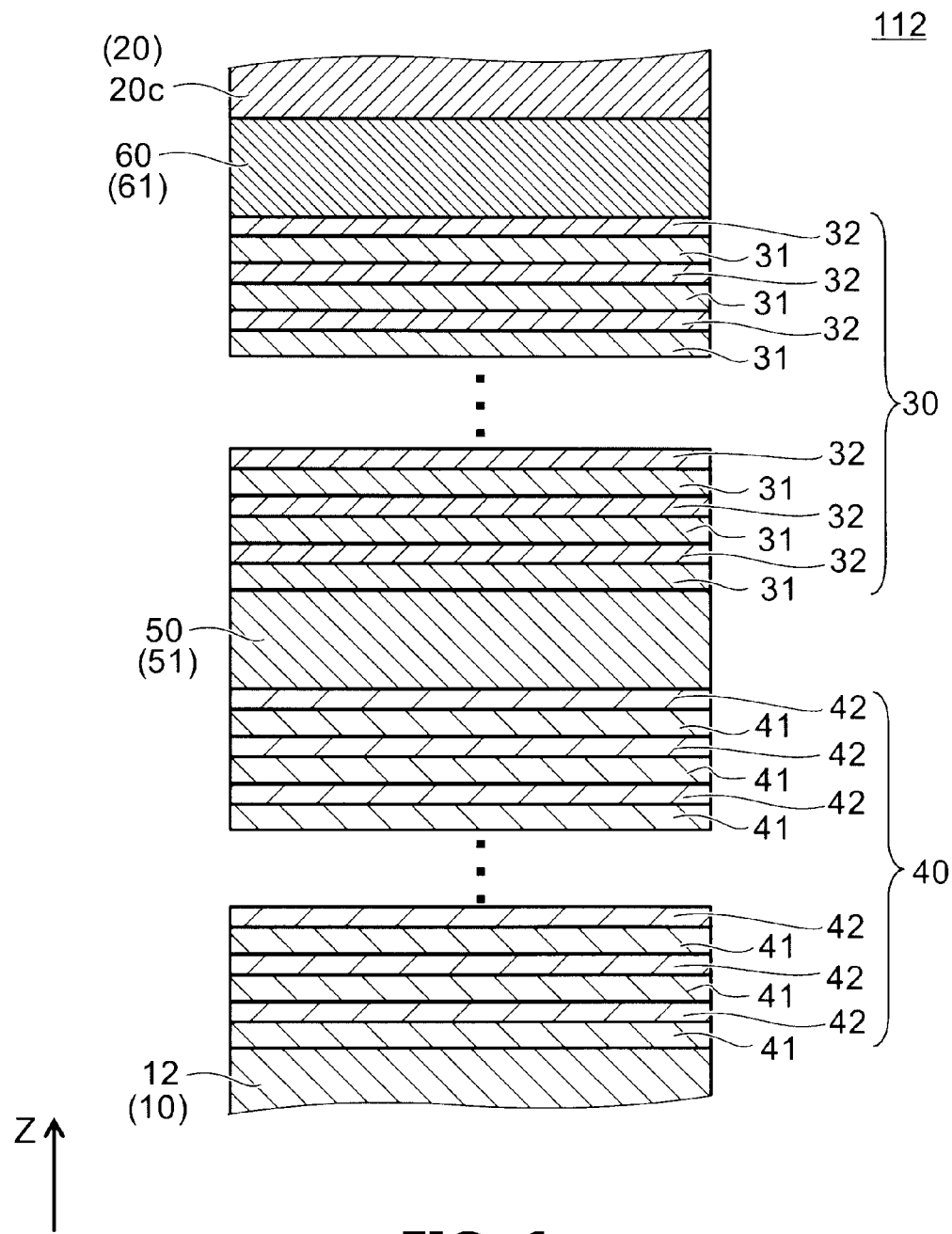
FIG. 6 is a schematic cross-sectional view showing part of a semiconductor light emitting device.

FIG. 6 is a schematic cross-sectional view illustrating part of the configuration of another semiconductor light emitting device according to the embodiment of the invention.

As shown in FIG. 6, a semiconductor light emitting device 112 according to the embodiment further includes a p-side intermediate layer 60 in the semiconductor light emitting device 110 illustrated in FIG. 1 and FIG. 2.

The p-side intermediate layer 60 is provided between a light emitting portion 30 and a p-type semiconductor layer 20. The p-side intermediate layer 60 includes a fifth layer 61 containing $Al_{z1}Ga_{1-z1}N$ layer ($0<z1\leqq0.01$).

The Al composition ratio z1 of the fifth layer 61 may be the same as or different from the Al composition ratio y1 of a third layer 51 and the Al composition ratio y2 of a fourth layer 52. The Al composition ratio z1 is set to be larger than 0 and equal to or smaller than 0.01. When the Al composition ratio z1 is larger than 0.1, crystallinity is prone to be deteriorated. As a result, the light emitting efficiency is prone to be deteriorated.

In the embodiment, the p-side intermediate layer 60 is provided between the light emitting portion 30 and the p-type AlGaN layer 20c of the p-type semiconductor layer 20. However, the embodiment is not limited thereto. Similar to the semiconductor light emitting device 110 illustrated in FIG. 1, the GaN cap layer 20a may be provided between the light emitting portion 30 and the p-type semiconductor layer 20, and the p-side intermediate layer 60 may be provided between the light emitting portion 30 and the GaN cap layer 20a. In this case, an AlGaN cap layer 20b may be further provided between the GaN cap layer 20a and the p-type semiconductor layer 20 (the p-type AlGaN layer 20c).

In the semiconductor light emitting device 112 in which the p-side intermediate layer is further included, the compressive stress to be accumulated in the stacked semiconductor layers can be further suppressed by the p-side intermediate layer 60 and the stress in the semiconductor layers is further relaxed. Thus, a semiconductor light emitting device that operates at a lower operating voltage and achieves high light emitting efficiency can be obtained.

Figure 7:
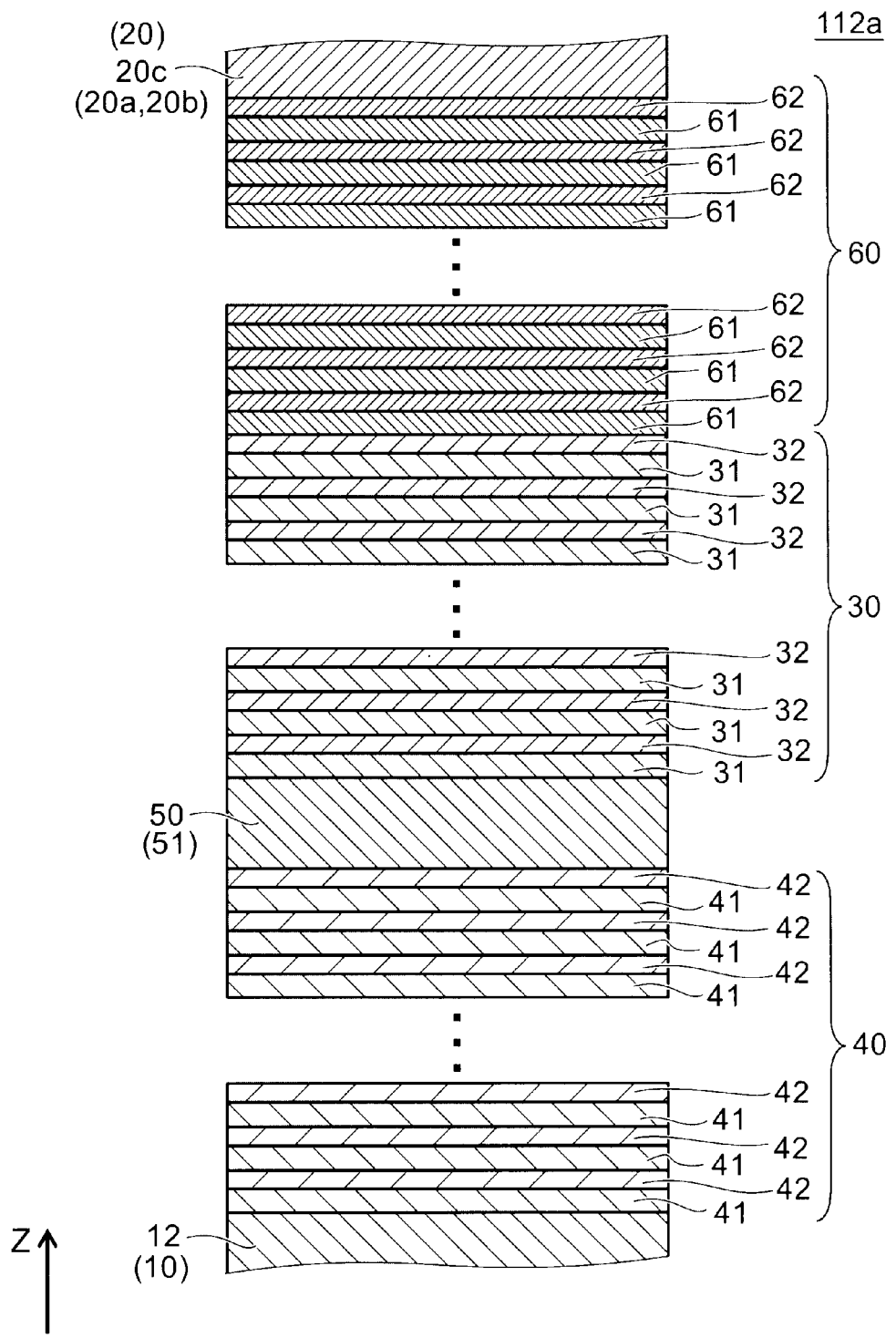
FIG. 7 is a schematic cross-sectional view showing part of a semiconductor light emitting device.

FIG. 7 is a schematic cross-sectional view illustrating part of the configuration of another semiconductor light emitting device according to the embodiment of the invention.

As shown in FIG. 7, multiple fifth layers 61 are provided in a semiconductor light emitting device 112a according to the embodiment. The multiple fifth layers 61 are stacked with one another. In other words, the multiple fifth layers 61 are stacked along the Z-axis direction.

In addition, the p-side intermediate layer 60 further includes sixth layers 62, each of which is provided between the fifth layers 61. The sixth layer 62 contains a p-type impurity whose concentration is higher than that of the p-type impurity contained in the fifth layer 61. Moreover, the sixth layer 62 contains $Al_{z2}Ga_{1-z2}N$ ($0<z2\leqq0.01$). Here, the Al composition rate z2 in the sixth layer 62 may be the same as or different from the Al composition ratio z1 in the fifth layer 61. The Al composition ratio z2 in the sixth layer 62 may be the same as or different from the Al composition ratio y1 of the third layer 51 and the Al composition ratio y2 of the fourth layer 52. The Al composition ratio z2 is set to be larger than 0 and equal to or smaller than 0.01. When the Al composition ratio z2 is larger than 0.01, the crystallinity is prone to be deteriorated. As a result, the light emitting efficiency is prone to be deteriorated.

For example, the fifth layer 61 is a non-doped AlGaN layer and the sixth layer 62 is an Mg-doped AlGaN layer.

As described above, a multilayered structural body may be applied to the p-side intermediate layer 60. With this configuration, stress caused in semiconductor layers is relaxed. Thus, a semiconductor light emitting device that operates at a lower operating voltage and achieves high light emitting efficiency can be obtained.

Figure 8:
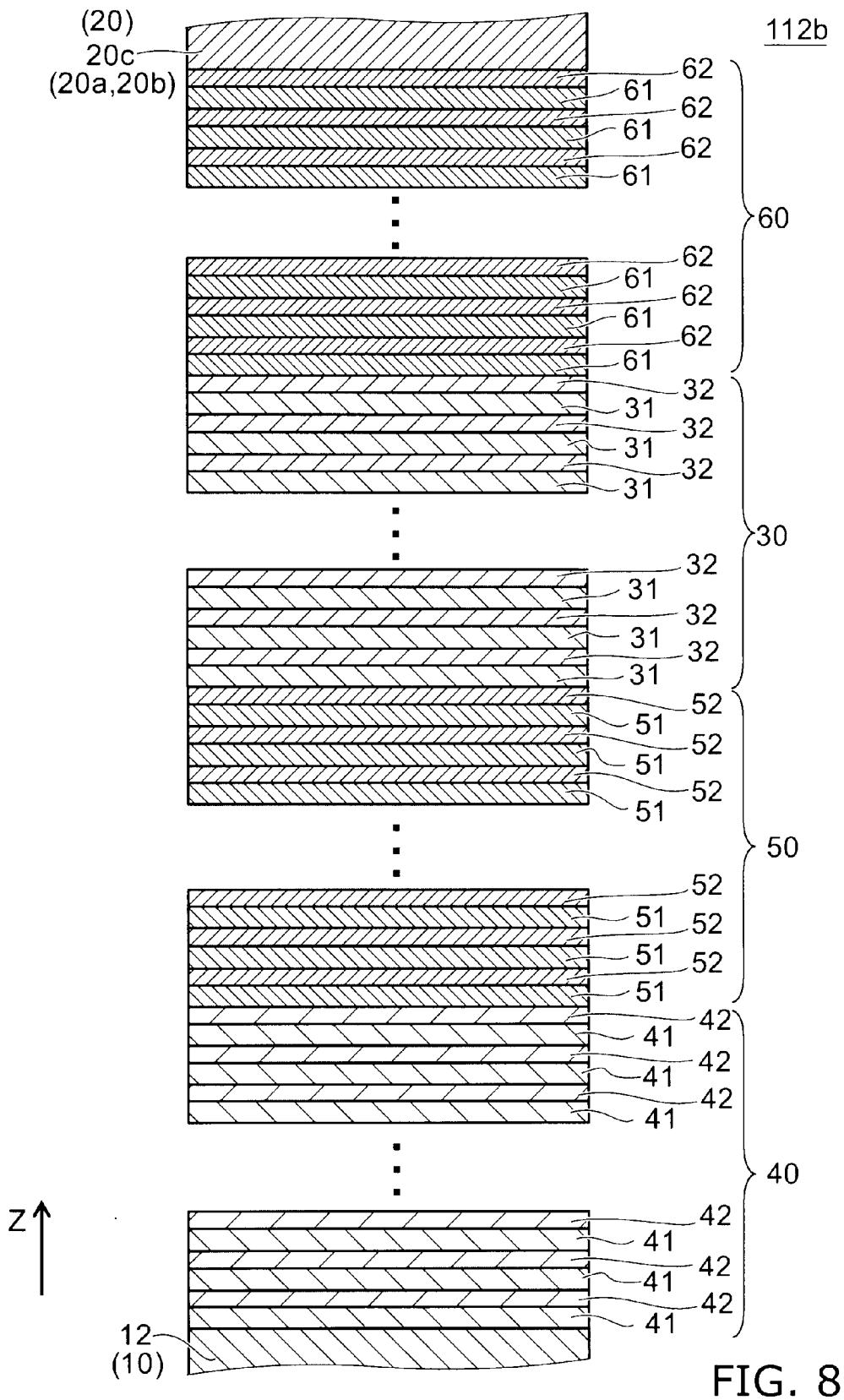
FIG. 8 is a schematic cross-sectional view showing part of a semiconductor light emitting device.

FIG. 8 is a schematic cross-sectional view illustrating part of the configuration of another semiconductor light emitting device according to the embodiment of the invention.

As shown in FIG. 8, another semiconductor light emitting device 112b according to the embodiment has an n-side intermediate layer 50 with a multilayered structural body (multiple third layers 51 and multiple fourth layers 52) and a p-side intermediate layer 60 with a multilayered structural body (multiple fifth layers 61 and multiple sixth layers 62).

The stress caused in the semiconductor layers is also relaxed in the semiconductor light emitting device 112b. Thus, a semiconductor light emitting device that operates at a lower operating voltage and achieves high light emitting efficiency can be obtained.

As described above, in the embodiment, an n-side intermediate layer 50 is provided between a multilayered structural body 40 and a light emitting portion 30. The n-side intermediate layer 50 is a single undoped AlGaN layer or a multilayer film in which an undoped AlGaN layer and a Si-doped GaN layer are stacked. This n-side intermediate layer 50 has a function to relax the stress, so that the compressive stress caused in the multilayered structural body 40 and the light emitting portion 30 having InGaN layer is relaxed. Accordingly, the defects to be generated in the stacked interface and the distortions to be caused in the well layer 32 can be reduced. Thus, a semiconductor light emitting device that achieves sufficient light output and operates at a lower operating voltage can be obtained.

The description is given above by using the case where a C-plane sapphire substrate is used as the substrate 5. However, another substrate such as a GaN, SiC, or ZnO substrate may be used. In addition, the plane direction of the substrate 5 is not limited to the C-plane, and another plane, for example, a non-polar plane may be used.

Note that, in the embodiment, "nitride semiconductors" are intended to include semiconductors with all the compositions which are obtained by changing each of composition ratios x, y, and z in the respective ranges in the chemical formula: $B_xIn_yAl_zGa_{1-x-y-z}N$ ($0\leqq x\leqq 1$, $0\leqq y\leqq 1$, $0\leqq z\leqq 1$, $x+y+z\leqq 1$). Furthermore, in the above chemical formula, the "nitride semiconductors" are intended to include ones further containing the V group elements other than N (nitride), ones further containing various elements which are to be added to control various properties such as conductivity types, and ones further containing various elements which are contained unintentionally.

Hereinabove, exemplary embodiments of the invention are described with reference to specific examples. However, the invention is not limited to these specific examples. For example, various modifications made by one skilled in the art in regard to the configurations, sizes, material qualities, arrangements, etc., of components of semiconductor light emitting devices such as n-type semiconductor layers, p-type semiconductor layers, light emitting portions, well layers, barrier layers, multilayered structural bodies, n-side intermediate layers, p-side intermediate layers, first to sixth layers, electrodes, substrates, and buffer layers are included in the scope of the invention to the extent that the purport of the invention is included.

Further, any two or more components of the specific examples may be combined within the extent of technical feasibility; and are included in the scope of the invention to the extent that the purport of the invention is included.

Moreover, all semiconductor light emitting devices practicable by an appropriate design modification by one skilled in the art based on the semiconductor light emitting devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor light emitting device, comprising:
    an n-type semiconductor layer containing a nitride semiconductor;
    a p-type semiconductor layer containing a nitride semiconductor;
    a light emitting portion provided between the n-type semiconductor layer and the p-type semiconductor layer, the light emitting portion including:
        a plurality of barrier layers stacked mutually and containing GaN, and
        a well layer provided between one of the plurality of barrier layers and another of the plurality of barrier layers, the well layer containing $In_{x1}Ga_{1-x1}N$, where first In composition ratio x1 is an atomic ratio of In among group III elements;
    a multilayered structural body provided between the n-type semiconductor layer and the light emitting portion, the multilayered structural body including:
        a plurality of first layers stacked mutually and containing GaN, and
        a second layer provided between one of the plurality of first layers and another of the plurality of first layers, the second layer containing $In_{x2}Ga_{1-x2}N$, where second In composition ratio x2 is an atomic ratio of In among group III elements, the second In composition x2 being not less than 0.6 times of the first In composition ratio x1 and being lower than the first In composition ratio x1; and
    an n-side intermediate layer provided between the multilayered structural body and the light emitting portion and including
        a plurality of third layers stacked mutually and containing $Al_{y1}Ga_{1-y1}N$, where first Al composition ratio y1 is an atomic ratio of Al among group III elements, the first Al composition ratio y1 being higher than 0 and not higher than 0.01, and
        a fourth layer provided between one of the plurality of third layers and another of the plurality of third layers, the fourth layer contacting the one of the plurality of third layers and contacting the another of the plurality of third layers, the fourth layer containing an n-type impurity with a concentration higher than a concentration of an n-type impurity contained in the third layers, the fourth layer containing $Al_{y2}Ga_{1-y2}N$, where second Al composition ratio y2 is an atomic ratio of Al among group III elements, the second Al composition ratio being not lower than 0 and not higher than 0.01.

2. The device according to claim 1, wherein the third layer is a non-doped layer and the fourth layer is a Si-doped layer.

3. The device according to claim 1, wherein a number of the third layers is not less than 5 and not more than 25.

4. The device according to claim 1, further comprising a p-side intermediate layer provided between the light emitting portion and the p-type semiconductor layer and including a fifth layer containing $Al_{z1}Ga_{1-z1}N$ layer, where third Al composition ratio z1 is an atomic ratio of Al among group III elements, the third Al composition ratio z1 being higher than 0 and not higher than 0.01.

5. The device according to claim 4, wherein
    the fifth layer is provided in plurality, the plurality of fifth layers are mutually stacked, and
    the p-side intermediate layer further includes a sixth layer provided between one of the plurality of fifth layers and another of the plurality of fifth layers, the sixth layer containing an p-type impurity with a concentration higher than a concentration of an p-type impurity contained in the fifth layer, the sixth layer containing $Al_{z2}Ga_{1-z2}N$, where fourth Al composition ratio z2 is an atomic ratio of Al among group III elements, the fourth Al composition ratio z2 being not lower than 0 and not higher than 0.01.

6. The device according to claim 5, wherein the fifth layer is a non-doped layer and the sixth layer is an Mg-doped layer.

7. The device according to claim 1, wherein the first layer contains an n-type impurity.

8. The device according to claim 1, wherein a thickness of the first layer is not less than a thickness of the second layer.

9. The device according to claim 1, wherein the first layer and the second layer are superlattice layers.

10. The device according to claim 1, wherein the first In composition ratio x1 is not less than 0.12 and not more than 0.20.

11. The device according to claim 1, wherein the second In composition ratio x2 is not less than 0.08 and less than 0.12.

12. The device according to claim 1, wherein a thickness of the second layer is not more than 2 nanometers.

13. The device according to claim 1, wherein a thickness of the n-side intermediate layer is not more than 50 nanometers.

14. The device according to claim 1, wherein the n-type semiconductor layer includes a GaN layer and an n-type layer, the n-type layer being provided between the GaN layer and the multilayered structural body, the n-type layer containing one of GaN containing Si and InGaN containing Si.

15. The device according to claim 1, wherein the p-type semiconductor layer includes a first p-type GaN layer, a p-type AlGaN layer, and a second p-type GaN layer, the p-type AlGaN layer being provided between the first p-type GaN layer and the light emitting portion, the second p-type GaN layer being provided between the first p-type GaN layer and the p-type AlGaN layer, the second p-type GaN layer having a p-type impurity concentration lower than a p-type impurity concentration of the first p-type GaN layer.

16. The device according to claim 1, further comprising a GaN cap layer provided between the light emitting layer and the p-type semiconductor layer, and an AlGaN cap layer provided between the GaN cap layer and the p-type semiconductor layer.

17. The device according to claim 1, further comprising a substrate made of sapphire and provided on a side of the n-type semiconductor layer opposite to the p-type semiconductor layer, a major surface of the substrate facing the n-type semiconductor layer being inclined by an angle not smaller than 0.1 degrees and not more than 0.5 degrees with respect to an M-axis direction of the substrate.

18. The device according to claim 17, wherein the substrate includes concavity and convexity provided on the major surface.

19. The device according to claim 1, further comprising a substrate provided on a side of the n-type semiconductor layer opposite to the p-type semiconductor layer, the substrate including at least one of GaN, SiC and ZnO.

* * * * *